(12) United States Patent
Karasawa et al.

(10) Patent No.: US 7,872,874 B2
(45) Date of Patent: Jan. 18, 2011

(54) PRINTED-WIRING BOARD WITH BUILT-IN COMPONENT, MANUFACTURING METHOD OF PRINTED-WIRING BOARD WITH BUILT-IN COMPONENT, AND ELECTRONIC DEVICE

(75) Inventors: Jun Karasawa, Tokyo (JP); Daigo Suzuki, Yokohama (JP); Hidenori Tanaka, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 942 days.

(21) Appl. No.: 11/701,816

(22) Filed: Feb. 1, 2007

(65) Prior Publication Data
US 2007/0221398 A1    Sep. 27, 2007

(30) Foreign Application Priority Data
Mar. 24, 2006    (JP) ............................. 2006-084091

(51) Int. Cl.
*H05K 7/10*    (2006.01)
*H05K 7/12*    (2006.01)

(52) U.S. Cl. ...................... 361/767; 361/770; 361/774

(58) Field of Classification Search ................. 361/767, 361/770–774; 174/259–261
See application file for complete search history.

(56) References Cited

U.S. PATENT DOCUMENTS

| | | | | |
|---|---|---|---|---|
| 6,115,262 A | * | 9/2000 | Brunner et al. | ............. 361/774 |
| 6,169,253 B1 | * | 1/2001 | Jairazbhoy et al. | .......... 174/250 |
| 6,281,567 B1 | | 8/2001 | Murayama et al. | |
| 6,566,611 B2 | * | 5/2003 | Kochanowski et al. | ...... 174/261 |

FOREIGN PATENT DOCUMENTS

| | | |
|---|---|---|
| JP | 08-274211 | 10/1996 |
| JP | 2004-259888 | 9/2004 |

* cited by examiner

*Primary Examiner*—Tuan T Dinh
(74) *Attorney, Agent, or Firm*—Blakely, Sokoloff, Taylor & Zafman LLP

(57) ABSTRACT

According to one embodiment, there is provided a printed-wiring board with a component in which an electronic component is mounted on a pattern-forming surface of a base material. In the printed-wiring board, a guiding path for guiding, to the outside, a void formed in mounting the electronic component is formed on the pattern-forming surface.

3 Claims, 5 Drawing Sheets

PRINTED-WIRING BOARD WITH BUILT-IN COMPONENT, MANUFACTURING METHOD OF PRINTED-WIRING BOARD WITH BUILT-IN COMPONENT, AND ELECTRONIC DEVICE

CROSS-REFERENCE TO RELATED APPLICATIONS

This application is based upon and claims the benefit of priority from Japanese Patent Application No. 2006-084091, filed Mar. 24, 2006, the entire contents of which are incorporated herein by reference.

BACKGROUND

1. Field

One embodiment of the invention relates to a printed-wiring board incorporating a chip product included in electronic circuits, a manufacturing method of the printed-wiring board with a built-in component, and an electronic device using the printed-wiring board with a built-in component.

2. Description of the Related Art

Conventionally, as for component mounting techniques directed to printed-wiring boards, various techniques have been proposed which address negative effects of voids formed at the time of mounting components. For example, Japanese Patent Application Publication (KOKAI) No. H08-274211 discloses a technique which addresses formation of voids at the time of mounting BGA (ball grid array) components. This technique concentrates voids in a specific area, thereby preventing solder cracks caused by temperature cycling.

On the other hand, in recent years, as for a printed-wiring board forming a plurality of layers used in an electronic circuit device, a substrate manufacturing technique has been developed toward practical use. In this substrate manufacturing technique, a printed-wiring board with a built-in electronic component is manufactured by: solder bonding chip components, such as passive components, on a conductor pattern (pad) formed on an inner-layer side pattern-forming surface; and stacking an insulating material on the inner-layer side so as to cover the chip components with the insulating material. In the printed-wiring board with a built-in component having such a structure, voids (air pockets or gas pockets) are formed in the gap between the chip components and a surface on which the conductor pattern bonded to the chip components. If the voids formed in the gap are heated in various heating processes at the time of manufacturing substrates including, e.g., a subsequent stacking process and a component mounting (reflowing) process, or heated in, e.g., heat reception after the printed-wiring board is incorporated in an electronic device, various problems may occur due to thermal expansion of the voids, such as detachment of the conductor pattern, damage to the chip components, break in a circuit, degradation of rigidity of the board, etc.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, there is provided a printed-wiring board with a built-in component in which an electronic component is mounted on a pattern-forming surface of a base material. In the printed-wiring board, a guiding path for guiding, to the outside, a void formed in mounting the electronic component is formed on the pattern-forming surface. According to this embodiment, it is possible to provide a reliable printed-wiring board with a built-in component with a reduced cost. In addition, it is possible to provide an electronic device which can be expected to operate stably.

According to one embodiment of the invention, voids formed by a gaseous body (gas, air, etc.) that accumulate under the mounted electronic component are removed through a guiding path. The guiding path may be implemented between electrodes, which are formed on the pattern-forming surface and coupled to terminals of the electronic component. Alternatively, the guiding path may be formed within the electrode or between electrodes formed on the pattern-forming surface.

Figure 1:
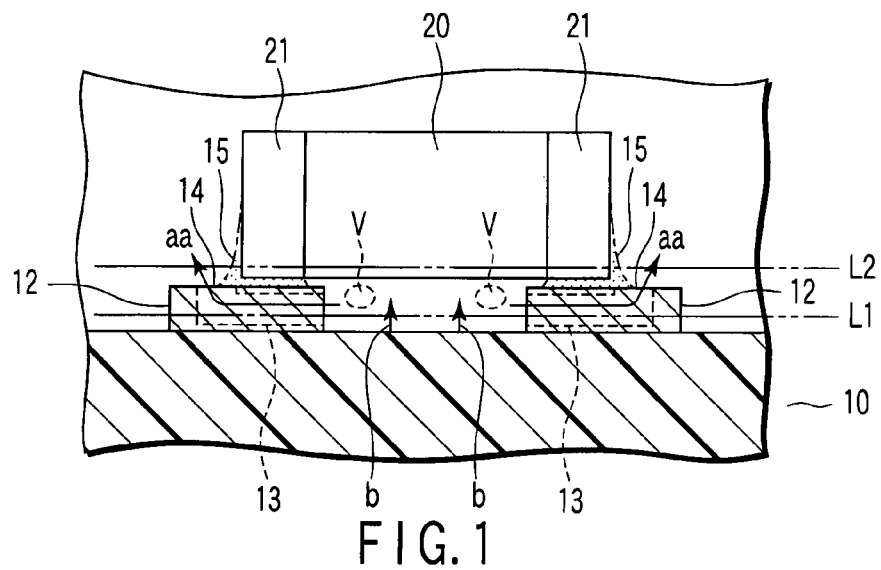
FIG. 1 is an exemplary sectional view showing the structure of a printed-wiring board with a built-in component according to a first embodiment of the invention which is under manufacturing.
Figure 2:
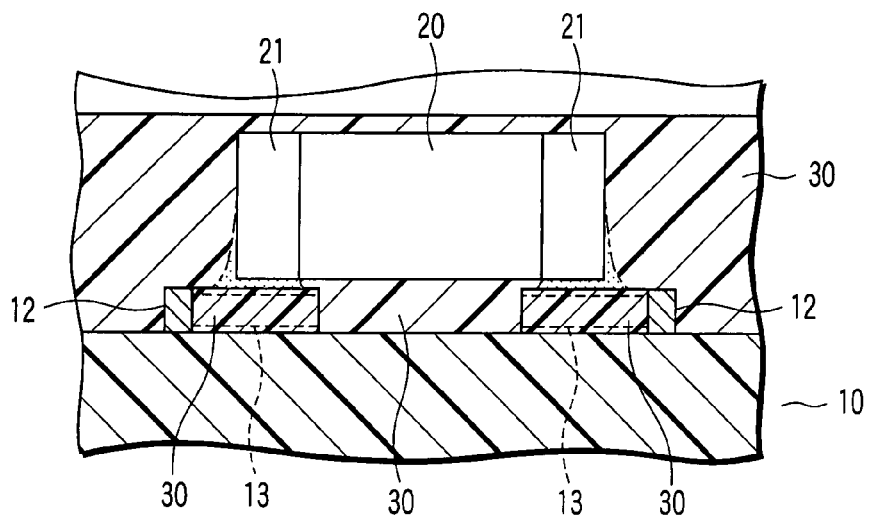
FIG. 2 is an exemplary sectional view showing the structure of the printed-wiring board with a built-in component according to the first embodiment of which manufacture is completed.
Figure 3:
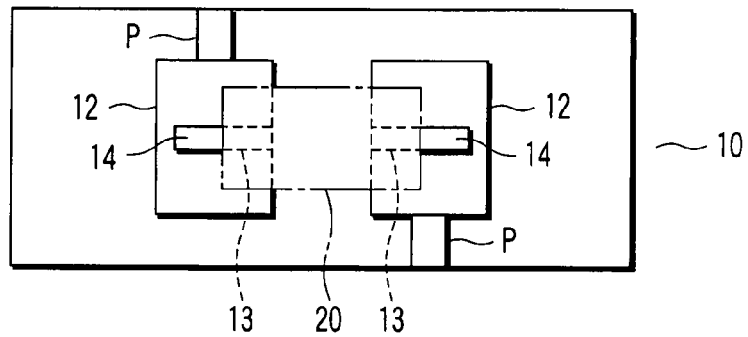
FIG. 3 is an exemplary plan view showing the structure of the printed-wiring board with a built-in component according to the first embodiment.

Referring to FIGS. 1 through 3, a description is given of a first embodiment of the invention. In the first embodiment, a rectangular parallelepiped-shape component including a pair of terminals on a body thereof, such as a capacitor and a resistance element, is used as an example of a built-in component (an electronic component mounted on an inner-layer side pattern-forming surface). However, the built-in component is not limited to these chip components, and an active element may be used which includes a specific function and two or more terminals.

As shown in FIGS. 1 through 3, a printed-wiring board with a built-in component according to the first embodiment of the invention includes a structure where guiding paths for guiding voids to outside are formed in a pair of electrodes 12, which are pattern-formed on a predetermined component-mounting surface portion of an inner-layer side pattern-forming surface of a base material 10.

The pair of electrodes 12, which are for solder bonding an electronic component 20 serving as the built-in component, are pattern-formed on the predetermined component-mounting surface portion of the inner-layer side pattern-forming surface of the base material 10, which forms an electric insulation substrate. In the electrodes 12, void guiding grooves 13 are formed for guiding, to outside of the component-mounting surface portion, voids (V) formed by a gaseous body (gas, air, etc.) which is accumulated under the mounted electronic component 20. The void guiding grooves 13 are formed by notches whose openings are provided in opposing surfaces of the pair of electrodes 12.

Terminals 21 of the electronic component 20 are solder bonded to the electrodes 12 with molten solder, and the electronic component 20 is mounted on the component-mounting surface portion. Consequently, void guiding paths (aa) are formed which extend from the openings of the notches toward end-opening portions 14 of the notches through beneath solder bonding portions 15.

After the electronic component 20 is mounted on the inner-layer side pattern-forming surface of the base material 10, interlayer resin 30, which forms an insulating layer, is supplied on the inner-layer side pattern-forming surface of the base material 10. When supplying the interlayer resin 30, if voids (V) are formed in the gap between the lower surface of the electronic component 20 and the component-mounting surface portion, the voids (V) exit from the opening portions 14 through the void guiding paths (aa) during a time period since the amount of supplied resin 30 reaches the position indicated by L1 until the amount of supplied resin 30 is further increased in the direction indicated by arrows b to reach the position indicated by L2. Thus, as shown in FIG. 2, in a state where a predetermined amount of the interlayer resin 30 is supplied on the inner-layer side pattern-forming surface of the base material 10, voids (V) do not exist in the gap between the lower surface of the electronic component 20 and the component-mounting surface portion, and the above-mentioned gap and the void guiding paths 13 are all filled with the interlayer resin 30.

As mentioned above, in the first embodiment of the invention, the void guiding paths (aa) are formed by providing the void guiding grooves 13 in the electrodes 12. Accordingly, it is possible to positively eliminate voids (V) which are formed in the gap between the lower surface of the electronic component 20 and the component-mounting surface portion. This void eliminating function can be realized by suitably designing the shapes of the electrodes 12, which are formed on the inner-layer pattern-forming surface of the base material 10. Thus, it is possible to manufacture a reliable printed-wiring board with built-in component by an economically advantageous manufacturing technique without including a process step of, e.g., resin injection for eliminating voids.

Figure 4:
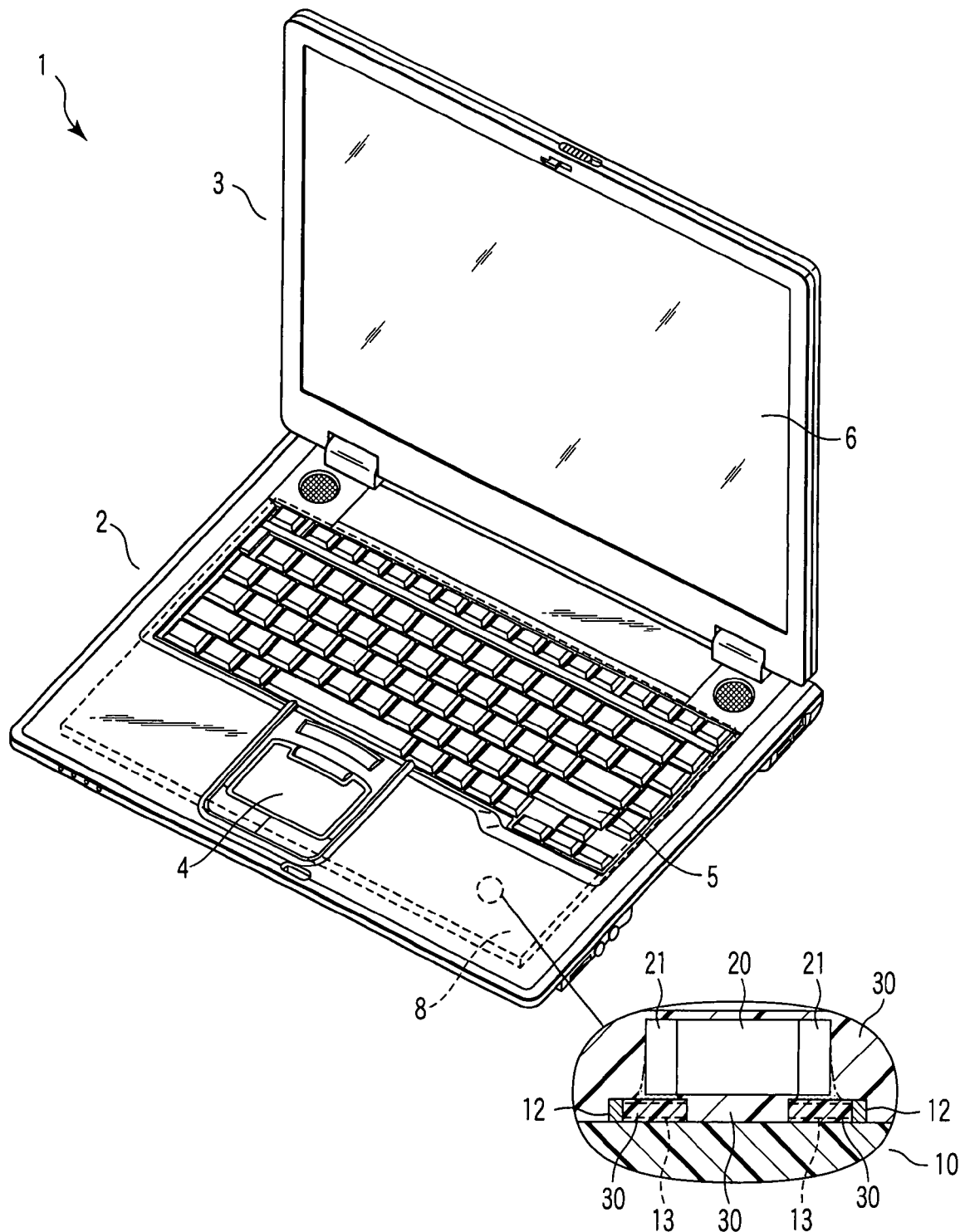
FIG. 4 is an exemplary diagram showing the structure of an electronic device according to a second embodiment of the invention.

FIG. 4 shows a second embodiment of the invention. The second embodiment is an electronic device using a printed-wiring board with a built-in component.

FIG. 4 shows the structure of the electronic device including a printed circuit board which uses the printed-wiring board with a built-in component according to the above-mentioned first embodiment. FIG. 4 shows an exemplary case where the printed-wiring board according to the first embodiment is used in a small electronic device such as a portable computer.

In FIG. 4, a display housing 3 is rotatably attached to a body 2 of a portable computer 1 via a hinge mechanism. The body 2 is provided with user input devices such as a pointing device 4, a keyboard 5, etc. The display housing 3 is provided with a display device 6, such as an LCD, etc.

In addition, the body 2 is also provided with a printed circuit board (mother board) 8 including a control circuit which controls the operation portions, such as the pointing device 4, the keyboard 5, etc., and the display device 6. The printed circuit board 8 is realized by using the printed-wiring board with a built-in component according to the first embodiment shown in FIGS. 1 through 3.

The printed-wiring board with a built-in component, which board is used for the printed circuit board 8, includes a structure where the void guiding paths (aa) are formed by providing the void guiding grooves 13 in the electrodes 12 on which the electronic component 20, forming the built-in component, is solder bonded. Thus, voids (V) do not exist in the gap between the lower surface of the electronic component 20 and the component-mounting surface portion. Accordingly, even if the printed circuit board 8 is heated by, for example, heat receiving after incorporation into the electronic device, the possibility is eliminated that thermal expansion of the voids may cause detachment of the conductor pattern, damage to the chip components, break in a circuit, degradation of rigidity of the board, etc. Thus, the device can operate stably. Further, manufacturing costs are reduced since it is possible to provide the printed-wiring board with a built-in component, which forms the printed circuit board 8, with a reduced cost.

FIGS. 5 through 16 show other embodiments of the invention where the electrode structure of the first embodiment is modified. It should be noted that, in each of the embodiments shown in FIGS. 5 through 16, an electronic component, which is solder bonded to electrodes, is indicated by a reference numeral 20 as in the first embodiment. Additionally, exemplary pattern structures are shown where electrodes (PA, PB, PC, . . . ) are provided in end portions of conductor patterns (P).

Figure 5:
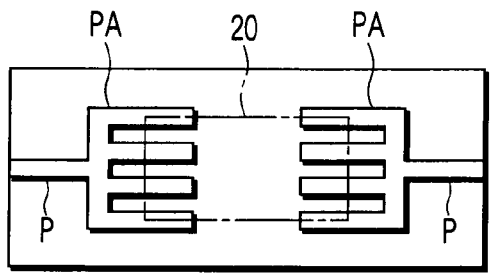
FIG. 5 is an exemplary plan view showing the electrode structure of a printed-wiring board with a built-in component according to a third embodiment of the invention.

FIG. 5 shows an electrode structure according to a third embodiment of the invention. The electrodes 12 according to the first embodiment shown in FIGS. 1 through 3 include the void guiding grooves 13 each formed by a single notch. On the other hand, in the electrode structure according to the third embodiment shown in FIG. 5, void guiding grooves formed by a plurality of notches are provided in electrodes PA. With such an electrode structure, it is possible to positively eliminate, by a plurality of void guiding paths arranged in parallel, voids formed in the gap between the lower surface of the electronic component 20 and the component-mounting surface portion.

Figure 6A:
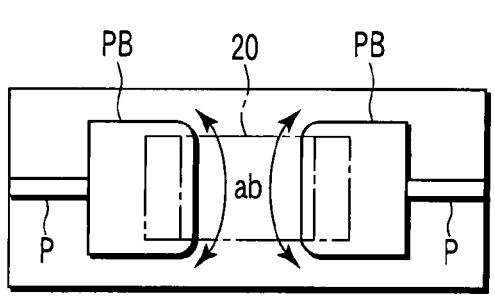
FIG. 6A is an exemplary plan view showing the electrode structure of a printed-wiring board with a built-in component according to a fourth embodiment of the invention.
Figure 6B:
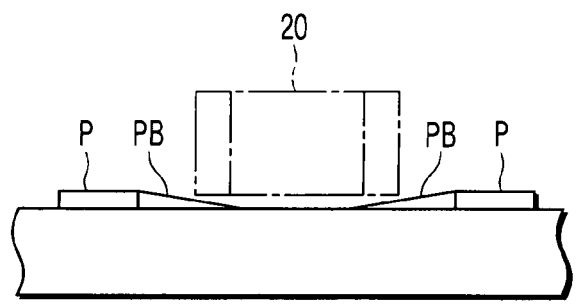
FIG. 6B is an exemplary sectional view showing the electrode structure of the printed-wiring board with a built-in component according to the fourth embodiment of the invention.

FIGS. 6A and 6B show an electrode structure according to a fourth embodiment of the invention. As shown in FIG. 6B, in the fourth embodiment, electrodes PB are formed into shapes whose height is gradually decreased toward the center of the component-mounting surface. With the electrodes PB, the mounting position of the electronic component 20 is set to be low, and thus it is difficult for voids to be formed. Further, as shown in FIG. 6A, the shapes of the electrodes PB are formed such that the corners are rounded toward the center of the component-mounting surface, thereby forming void guiding paths (ab).

Figure 7:
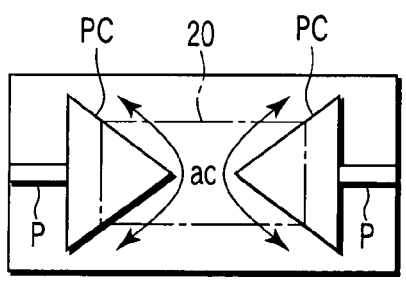
FIG. 7 is an exemplary plan view showing the electrode structure of a printed-wiring board with a built-in component according to a fifth embodiment of the invention.

FIG. 7 shows an electrode structure according to a fifth embodiment of the invention. Electrodes PC according to the fifth embodiment shown in FIG. 7 are formed into triangular shapes such that their apexes are pointed toward the center of the component-mounting surface. With the electrodes PC, void guiding paths (ac) are formed on the component-mounting surface.

Figure 8:
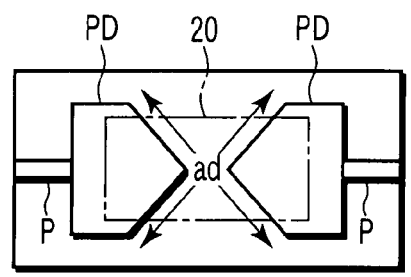
FIG. 8 is an exemplary plan view showing the electrode structure of a printed-wiring board with a built-in component according to a sixth embodiment of the invention.

FIG. 8 shows an electrode structure according to a sixth embodiment of the invention. Electrodes PD according to the sixth embodiment shown in FIG. 8 are formed such that only portions close to the center of the component-mounting surface are formed into triangular shapes with their apexes pointed toward the center of the component-mounting surface. With the electrodes PD, void guiding paths (ad) are formed on the component-mounting surface.

Figure 9:
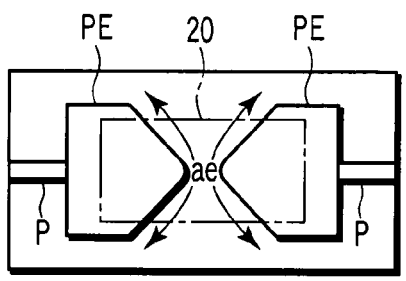
FIG. 9 is an exemplary plan view showing the electrode structure of a printed-wiring board with a built-in component according to a seventh embodiment of the invention.

FIG. 9 shows an electrode structure according to a seventh embodiment of the invention. Electrodes PE according to the seventh embodiment shown in FIG. 9 are formed such that only portions close to the center of the component-mounting surface are formed into triangular shapes with their apexes rounded and pointed toward the center of the component-mounting surface. With the electrodes PE, void guiding paths (ae) are formed on the component-mounting surface.

Figure 10:
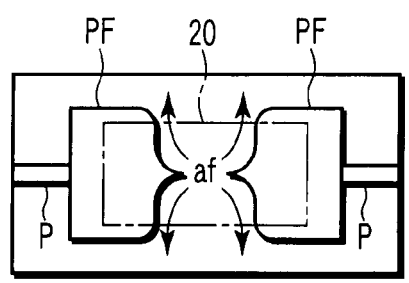
FIG. 10 is an exemplary plan view showing the electrode structure of a printed-wiring board with a built-in component according to an eighth embodiment of the invention.

FIG. 10 shows an electrode structure according to an eighth embodiment of the invention. Electrodes PF according to the eighth embodiment shown in FIG. 10 are formed such that portions facing the center of the component-mounting surface include pointed portions. With the electrodes PF, void guiding paths (af) are formed on the component-mounting surface.

Figure 11A:
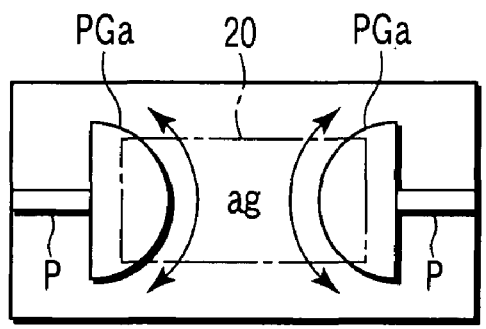
FIG. 11A is an exemplary plan view showing the electrode structure of a printed-wiring board with a built-in component according to a ninth embodiment of the invention.

FIG. 11A shows an electrode structure according to a ninth embodiment of the invention. Electrodes PGa according to the ninth embodiment shown in FIG. 11A are formed into semicircular shapes toward the center of the component-mounting surface. With the electrodes PGa, void guiding paths (af) are formed on the component-mounting surface.

Figure 11B:
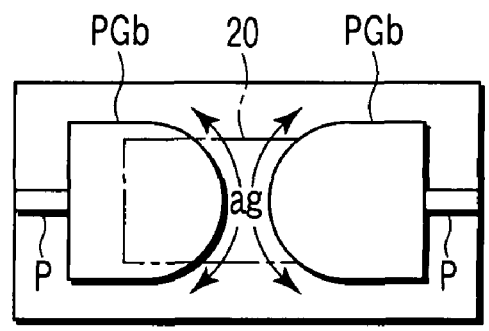
FIG. 11B is an exemplary plan view showing the electrode structure of a printed-wiring board with a built-in component according to a tenth embodiment of the invention.

FIG. 11B shows an electrode structure according to a tenth embodiment of the invention. Electrodes PGb according to the tenth embodiment shown in FIG. 11B are formed into arc shapes toward the center of the component-mounting surface.

With the electrodes PGb, void guiding paths (ag) are formed on the component-mounting surface.

Figure 12:
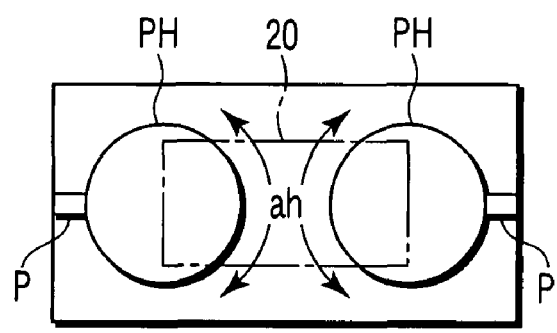
FIG. 12 is an exemplary plan view showing the electrode structure of a printed-wiring board with a built-in component according to an eleventh embodiment of the invention.

FIG. 12 shows an electrode structure according to an eleventh embodiment of the invention. Electrodes PH according to the eleventh embodiment shown in FIG. 12 are formed into circular shapes. With the electrodes PH, void guiding paths (ah) are formed on the component-mounting surface.

Figure 13:
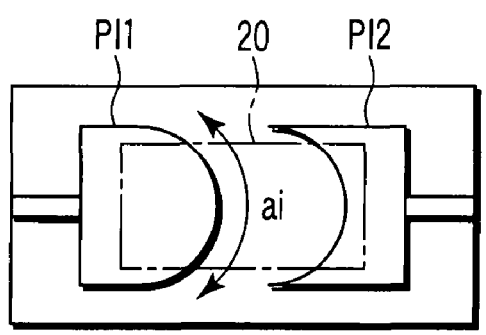
FIG. 13 is an exemplary plan view showing the electrode structure of a printed-wiring board with a built-in component according to a twelfth embodiment of the invention.

FIG. 13 shows an electrode structure according to a twelfth embodiment of the invention. Electrodes PI1 and PI2 according to the twelfth embodiment shown in FIG. 13 are formed into a convex arc shape and a concave arc shape, respectively, toward the center of the component-mounting surface. With the electrodes PI1 and PI2, a void guiding path (ai) is formed on the component-mounting surface.

Figure 14:
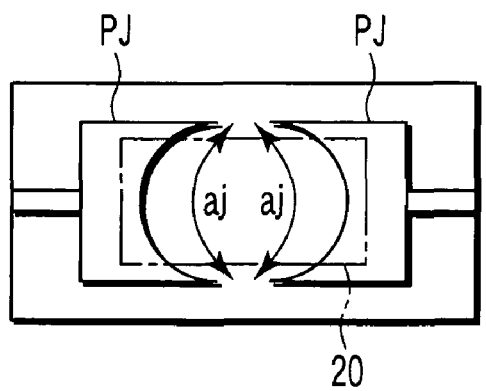
FIG. 14 is an exemplary plan view showing the electrode structure of a printed-wiring board with a built-in component according to a thirteenth embodiment of the invention.

FIG. 14 shows an electrode structure according to a thirteenth embodiment of the invention. Electrodes PJ according to the thirteenth embodiment shown in FIG. 14 are formed into concave arc shapes toward the center of the component-mounting surface. With the electrodes PJ, void guiding paths (aj) are formed on the component-mounting surface.

Figure 15:
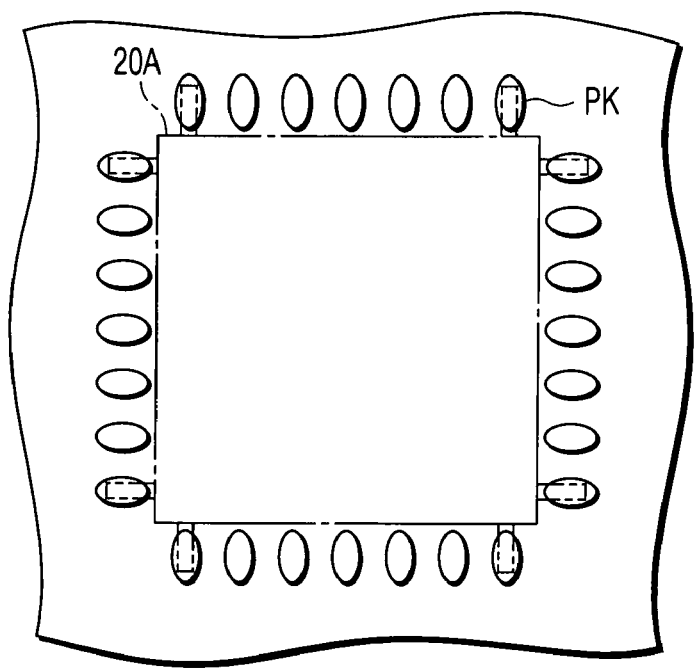
FIG. 15 is an exemplary plan view showing the electrode structure of a printed-wiring board with a built-in component according to a fourteenth embodiment of the invention.

FIG. 15 shows an electrode structure according to a fourteenth embodiment of the invention. In the fourteenth embodiment shown in FIG. 15, an electrode structure according to any one of the above-mentioned embodiments of the invention may be applied to a semiconductor package mounting surface. In this case, electrodes PK, each having an elliptical shape, are solder bonded to corresponding terminals of a multi-pin electronic component 20A such as a QFP (quad flat package). Thus, voids formed under the electronic component 20A can easily exit from between the adjacent electrodes PK.

Figure 16:
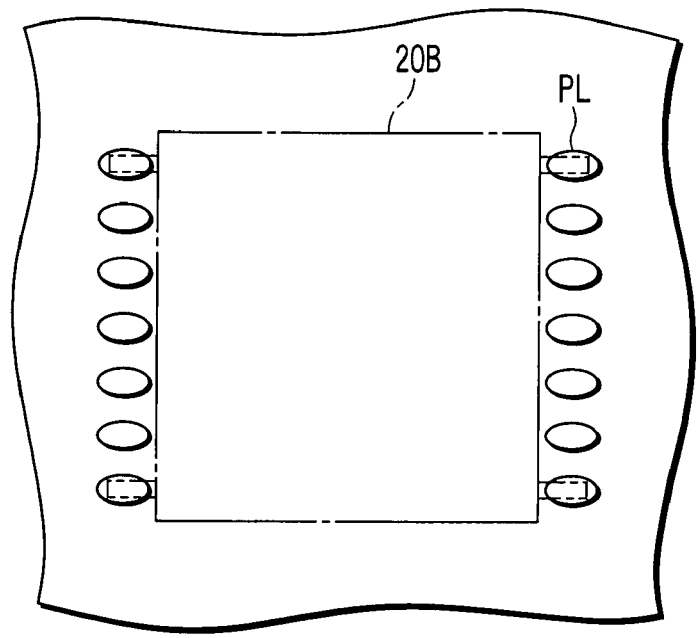
FIG. 16 is an exemplary plan view showing the electrode structure of a printed-wiring board with a built-in component according to a fifteenth embodiment of the invention.

FIG. 16 shows an electrode structure according to a fifteenth embodiment of the invention. In the fifteenth embodiment shown in FIG. 16, as in the fourteenth embodiment shown in FIG. 15, an electrode structure according to any one of the above-mentioned embodiments of the invention may be applied to a semiconductor package mounting surface. In this case, electrodes PL, each having an elliptical shape, are solder bonded to corresponding terminals of a multi-pin electronic component 20B such as an SOP (small outline package). Thus, voids formed under the electronic component 20B can easily exit from between the adjacent electrodes PL.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A printed-wiring board comprising:
   a base material including a pattern-forming surface;
   electrodes formed on the pattern-forming surface;
   an electronic component mounted on the electrodes; and
   a guiding path formed between the electrodes and on or above the pattern-forming surface and below the electronic component in order to remove a void formed between the electronic component and the pattern-forming surface, the guiding path comprises a guiding groove formed in the electrodes;
   wherein the electrodes are formed into shapes whose heights are gradually decreased toward a center of the pattern-forming surface, and the electrodes are coupled to terminals of the electronic component and formed such that portions of the electrodes close to a center of the pattern-forming surface are formed into triangular shapes with their apexes rounded and pointed toward the center of the pattern-forming surface.

2. A method for manufacturing a printed-wiring board, comprising:

placing electrodes for an electronic component on a pattern-forming surface of the printed-wiring board and forming a guiding groove in the electrodes, the electrodes being shaped to form a guide path between the electrodes and on or above the pattern-forming surface and below the electronic component in order to remove a void formed between the electronic component and the pattern-forming surface, the electrodes being formed into shapes whose heights are gradually decreased toward a center of the pattern-forming surface, and the electrodes being formed such that portions of the electrodes close to a center of the pattern-forming surface are formed into triangular shapes with their apexes rounded and pointed toward the center of the pattern-forming surface; and mounting the component on the electrodes.

3. An electronic device comprising:

a body with a user input device; and a printed-wiring board provided in the body, the printed-wiring board comprising:

a base material including a pattern-forming surface, electrodes formed on the pattern-forming surface, an electronic component mounted on the electrodes, and a guiding path formed between the electrodes and on or above the pattern-forming surface and below the electronic component in order to remove a void formed between the electronic component and the pattern-forming surface, the guiding path comprises a guiding groove formed in the electrodes;

wherein the electrodes are formed into shapes whose heights are gradually decreased toward a center of the pattern-forming surface, and the electrodes are formed such that portions of the electrodes close to a center of the pattern-forming surface are formed into triangular shapes with their apexes rounded and pointed toward the center of the pattern-forming surface.

* * * * *